US005652580A

United States Patent [19]

Saxena

[11] Patent Number: 5,652,580
[45] Date of Patent: Jul. 29, 1997

[54] METHOD AND APPARATUS FOR DETECTING DUPLICATE ENTRIES IN A LOOK-UP TABLE

[75] Inventor: Nirmal R. Saxena, San Jose, Calif.

[73] Assignee: HaL Computer Systems, Inc., Campbell, Calif.

[21] Appl. No.: 488,816

[22] Filed: Jun. 9, 1995

[51] Int. Cl.⁶ .................................................... H03M 7/00
[52] U.S. Cl. ......................... 341/50; 371/21.5; 371/21.1; 371/67.1; 341/94
[58] Field of Search ....................... 341/50, 94; 371/21.5, 371/21.1, 67.1, 49.1; 365/49

[56] References Cited

U.S. PATENT DOCUMENTS

| 3,963,908 | 6/1976 | Das ........................................ 235/153 |
| 4,547,882 | 10/1985 | Tanner ..................................... 371/38 |
| 5,052,002 | 9/1991 | Tanagawa ............................... 371/51.1 |
| 5,220,526 | 6/1993 | Giles et al. ............................... 365/49 |

OTHER PUBLICATIONS

Hayes, John P., Introduction to Digital Logic Design, Addison–Wesley, 1993: pp. 104–107.

Primary Examiner—Jeffrey A. Gaffin
Assistant Examiner—Jason L. W. Kost
Attorney, Agent, or Firm—Fenwick & West LLP

[57] ABSTRACT

A method and apparatus detects whether more than one object has been selected from a set of objects. A unique code and an error code is coupled to objects in the set. At least one object is selected and the unique codes from the selected object are logically summed, as are the error codes from the selected objects. A test code is generated from the logically summed unique code and tested for equality with the logically summed error code to determine if more than one object was selected.

20 Claims, 10 Drawing Sheets

METHOD AND APPARATUS FOR DETECTING DUPLICATE ENTRIES IN A LOOK-UP TABLE

FIELD OF INVENTION

This invention relates to electronic logic design and specifically to electronic logic design in a microprocessor.

RELATED APPLICATIONS

The subject matter of this application is related to the following applications:

application Ser. No. 08/488,941 entitled "Method, System and Apparatus for Efficiently Generating Binary Numbers for Testing Storage Devices" filed on Jun. 9, 1995 by Nirmal R. Saxena;

application Ser. No. 08/488,615 entitled "Method and Apparatus for Detecting Memory Addressing Errors" filed on Jun. 9, 1995 by Nirmal R. Saxena;

application Ser. No. 08/457,049 entitled "METHOD AND APPARATUS FOR ROTATING ACTIVE INSTRUCTIONS IN A PARALLEL DATA PROCESSOR" filed on Jun. 1, 1995 by Sunil Savkar, Michael C. Shebanow, Gene W. Shen, and Farnad Sajjadian;

application Ser. No. 08/456,746 entitled "PROGRAMMABLE INSTRUCTION TRAP SYSTEM AND METHOD" filed on Jun. 1, 1995 by Sunil Savkar, Gene W. Shen, Farnad Sajjadian, and Michael C. Shebanow;

application Ser. No. 08/388,602 entitled "INSTRUCTION FLOW CONTROL CIRCUIT FOR SUPER-SCALER MICROPROCESSOR" filed on Feb. 14, 1995 by Takeshi Kitahara;

application Ser. No. 08/388,389 entitled "ADDRESSING METHOD FOR EXECUTING LOAD INSTRUCTIONS OUT OF ORDER WITH RESPECT TO STORE INSTRUCTIONS" filed on Feb. 14, 1995 by Michael A. Simone and Michael C. Shebanow;

application Ser. No. 08/388,606 entitled "METHOD AND APPARATUS FOR EFFICIENTLY WRITING RESULTS TO RENAMED REGISTERS" filed on Feb. 14, 1995 by DeForest W. Tovey, Michael C. Shebanow and John Gmuender;

application Ser. No. 08/388,364 entitled "METHOD AND APPARATUS FOR COORDINATING THE USE OF PHYSICAL REGISTERS IN A MICROPROCESSOR" filed on Feb. 14, 1995 by DeForest W. Tovey, Michael C. Shebanow and John Gmuender;

application Ser. No. 08/390,885 entitled "PROCESSOR STRUCTURE AND METHOD FOR TRACKING INSTRUCTION STATUS TO MAINTAIN PRECISE STATE" filed on Feb. 14, 1995 by Gene W. Shen, John Szeto, Niteen A. Patkar and Michael C. Shebanow;

application Ser. No. 08/397,810 entitled "PARALLEL ACCESS MICRO-TLB TO SPEED UP ADDRESS TRANSLATION" filed on Mar. 3, 1995 by Chih-Wei David Chang, Kioumars Dawallu, Joel F. Boney, Ming-Ying Li and Jen-Hong Charles Chen;

application Ser. No. 08/397,809 entitled "LOOKASIDE BUFFER FOR ADDRESS TRANSLATION IN A COMPUTER SYSTEM" filed on Mar. 3, 1995 by Leon Kuo-Liang Peng, Yolin Lih and Chih-Wei David Chang;

application Ser. No. 08/397,893 entitled "RECLAMATION OF PROCESSOR RESOURCES IN A DATA PROCESSOR" filed on Mar. 3, 1995 by Michael C. Shebanow, Gene W. Shen, Ravi Swami, Niteen Patkar;

application Ser. No. 08/397,891 entitled "METHOD AND APPARATUS FOR SELECTING INSTRUCTIONS FROM ONES READY TO EXECUTE" filed on Mar. 3, 1995 by Michael C. Shebanow, John Gmuender, Michael A. Simone, John R. F. S. Szeto, Takumi Maruyama and DeForest W. Tovey;

application Ser. No. 08/397,911 entitled "HARDWARE SUPPORT FOR FAST SOFTWARE EMULATION OF UNIMPLEMENTED INSTRUCTIONS" filed on Mar. 3, 1995 by Shalesh Thusoo, Farnad Sajjadian, Jaspal Kohli, and Niteen Patkar;

application Ser. No. 08/398,284 entitled "METHOD AND APPARATUS FOR ACCELERATING CONTROL TRANSFER RETURNS" filed on Mar. 3, 1995 by Akiro Katsuno, Sunil Savkar and Michael C. Shebanow;

application Ser. No. 08/398,066 entitled "METHODS FOR UPDATING FETCH PROGRAM COUNTER" filed on Mar. 3, 1995 by Akira Katsuno, Niteen A. Patkar, Sunil Savkar and Michael C. Shebanow;

application Ser. No. 08/397,910 entitled "METHOD AND APPARATUS FOR PRIORITIZING AND HANDLING ERRORS IN A COMPUTER SYSTEM" filed on Mar. 3, 1995 by Chih-Wei David Chang, Joel Fredrick Boney and Jaspal Kohli;

application Ser. No. 08/398,151 entitled "METHOD AND APPARATUS FOR RAPID EXECUTION OF CONTROL TRANSFER INSTRUCTIONS" filed on Mar. 3, 1995 by Sunil W. Savkar;

application Ser. No. 08/397,800 entitled "METHOD AND APPARATUS FOR GENERATING A ZERO BIT STATUS FLAG IN A MICROPROCESSOR" filed on Mar. 3, 1995 by Michael Simone;

application Ser. No. 08/397,912 entitled "ECC PROTECTED MEMORY ORGANIZATION WITH PIPELINED READ-MODIFY-WRITE ACCESS" filed on Mar. 3, 1995 by Chien Chen and Yizhi Lu; and application Ser. No. 08/398,299 entitled "PROCESSOR STRUCTURE AND METHOD FOR TRACKING INSTRUCTION STATUS TO MAINTAIN PRECISE STATE" filed on Mar. 3, 1995 by Chien Chen, John R. F. S. Szeto, Niteen A. Patkar, Michael C. Shebanow, Hideki Osone, Takumi Maruyama and Michael A. Simone;

each of the above applications are incorporated herein by reference in their entirety.

BACKGROUND OF THE INVENTION

Figure 1:
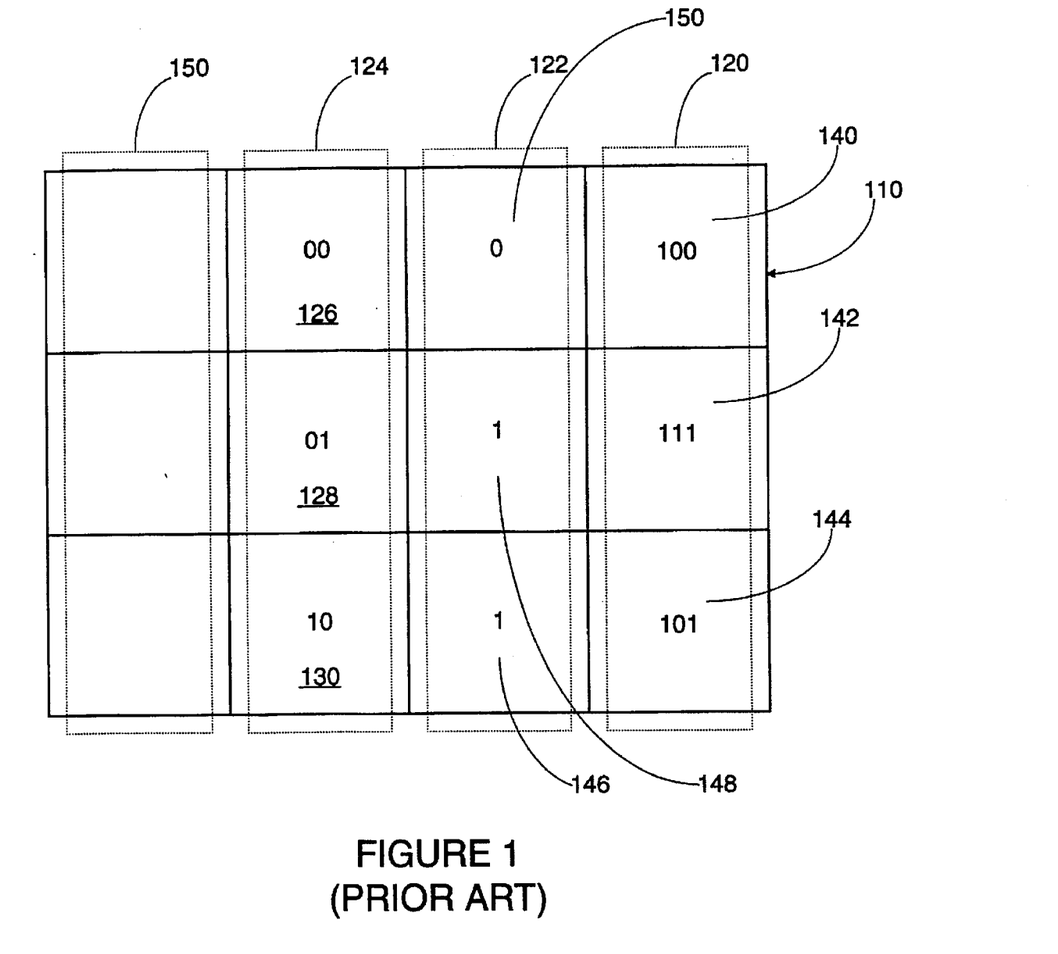
FIG. 1 is block schematic diagram of a conventional look-up table arranged in memory.

Look-up tables are commonly used in various fields including microprocessor design. Referring now to FIG. 1, a conventional look-up table 110 consists of several columns 120, 122, 124, 150. The data in each column 120, 122, 124, 150 may arranged by placing related data 130, 144, 146 in a single row. In one embodiment and in FIG. 1, the related data 130, 144, 146 is physically arranged in row format, although other physical arrangements are also possible. In a conventional look-up table 110, the entries 140, 142, 144 in one column 120 are used as the index to the table 110. A specific value of the data 140, 142, 144 in the index column 120 may be searched or "looked-up", and if found, other related data in the same row may be output. Sometimes the index entry 140, 142, 144 in the found row is itself output.

Unfortunately, the index data 140, 142, 144 may sometimes become corrupted due to various factors such as a malfunctioning data memory cell or electrical interference at the time the data 140, 142, 144 is written into the physical storage device representing the look-up table 110. When this occurs, erroneous data may be stored and corrupt the result of the search. For example, if data 140 is erroneously stored as having a value of 101, two entries 140, 144 will match a desired index entry of 101. Depending on the search mechanism, the output related to the location of duplicate entries may be erroneous, because the wrong row is flagged for output, or a combination of the data from both rows is selected for output.

Designing output circuitry which allows for detection of multiple identical index entries may add complexity to the output circuitry which would impede the performance of the system and require valuable space on an integrated circuit. It is desirable to detect such a condition without significant impediment to the performance of the output circuitry or requiring significant amounts of space on an integrated circuit.

SUMMARY OF INVENTION

In accordance with the present invention methods and apparati detect the presence of two or more identical entries in a look up table. An error code is generated using an index having a low likelihood of duplication, such as a row number in a ROM. The error codes corresponding to the entries in the look up table matching a desired value are logically OR-ed and the result is examined to identify if the error code matches the error code of the desired value. If so, multiple matches are unlikely. If not, multiple matches are likely. Because the OR function is used, the detection circuitry is efficiently implemented in integrated circuits.

BRIEF DESCRIPTION OF PREFERRED EMBODIMENT

Referring now to FIG. 1, a four column, three row look-up table is shown although other numbers of columns and rows may be used. In one embodiment, a column designated as the non-repeating column 124 contains a non-repeated set of numbers. A non-repeated set of numbers is a set of numbers in which no two elements of the set are identical. It is helpful, though not required, to have a non-repeating column which is extremely unlikely to have any repeated numbers. In one embodiment, the non-repeated numbers are the row numbers, in binary format, beginning with row 0, and these row numbers 126, 128, 130 are stored in a ROM, which makes them highly unlikely to be subject to errors which could cause a repeated numbers in the column 124. The row numbers may be stored as shown in FIG. 1, or they may be generated as required just prior to the calculation of the error code for the row as described below.

A second column 120, designated as the index column, contains a set of numbers which will be "looked up" or searched to locate an entry in column 120 equal to one or more specified numbers. In one embodiment, the index column 120 is supposed to contain a set of numbers which are all unique, producing no more than a single entry for each search. In this embodiment, the present invention is used to detect duplicate entries in the index column 120, that is, a number in one row of column 120 which is repeated at least once in another row of column 120. In other embodiments, the present invention may be used to detect any search which produces two or more entries as a result.

In one embodiment, a search enable column 122 is provided to restrict the search to entries in index column 120 which are in the same row as an entry in the search enable column 122 having a specified value. For example, because rows 1 and 2 have search enable column entries 146, 148 having a value of 1, only those rows would be included in the search, and row 0 would be skipped, or not searched. The use of a search enable column 122 is not required by the present invention.

In the present invention, an error-detection code for several or all rows is generated based on the non-repeating column 124 entry for that row and coupled to the row from which the error-detection code was generated to allow for the detection of errors as described below. The error detection code may be stored in a column 150 or generated as needed.

The number of bits in the error-detection code is greater than or equal to the $\log_2$ of N, where N is at least the number of bits required to represent the non-repeating numbers 126, 128, 130 in the non-repeating column 124. In one embodiment, the error detection code is equal to the complement of the number of bits equal to a particular value, such as "1" in the non-repeating column. The complement of a binary number is equal to that binary number with each original "1" replaced by a "0", and each original "0" replaced with a "1". For example, to generate the error code for non-repeating number 130 equal to 10 the number 10 has one bit equal to "1". One is represented as binary 01, and the complement of 01 is 10.

Figure 2A:
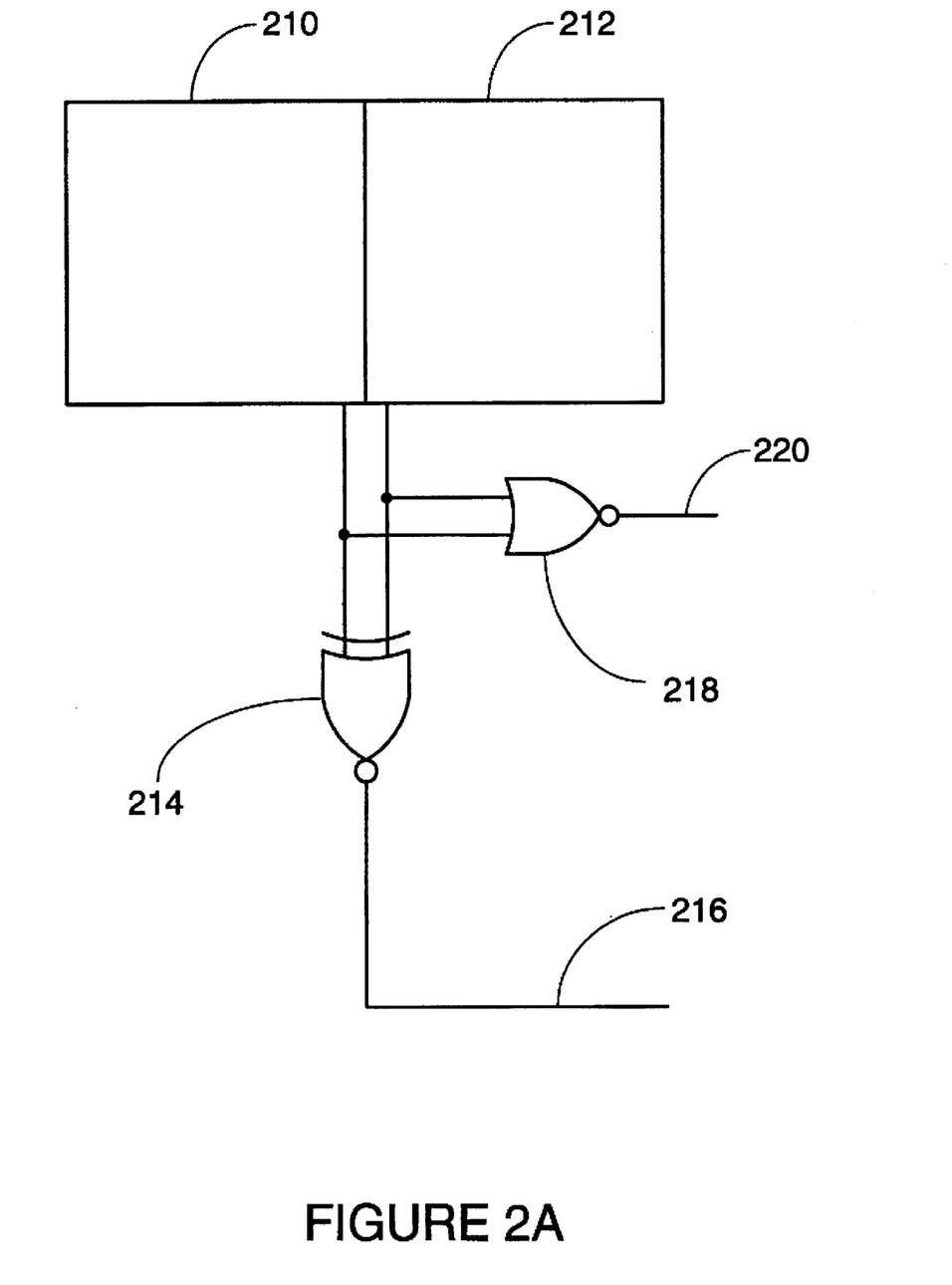
FIG. 2A is a schematic diagram of a device which produces a two-bit output equal to the complement of a count of the number of set bits at the input according to the present invention.

Referring now to FIG. 2A, one embodiment of an apparatus for producing the complement of the count of the number of set bits in a two bit word is shown. Each bit 210, 212 in the word is coupled to an EXCLUSIVE-NOR-gate 214 to produce the low order output 216 for the apparatus. The two bits 210, 212 are coupled to a 2 input NAND-gate 218 to produce the high order output 220 for the apparatus. The outputs 216, 220 may be coupled to the row corresponding to the two bits 210, 212. Referring now to FIGS. 1 and 2A, the two bits 210, 212 correspond to the bits in single row of non-repeating column 124. The output 216, 220 might be stored in column 150 in the same row from which the two bits 210, 212 came. Alternatively, the output 216, 220 could be computed at or about the time a search on the index column 120 described below is performed.

Figure 2B:
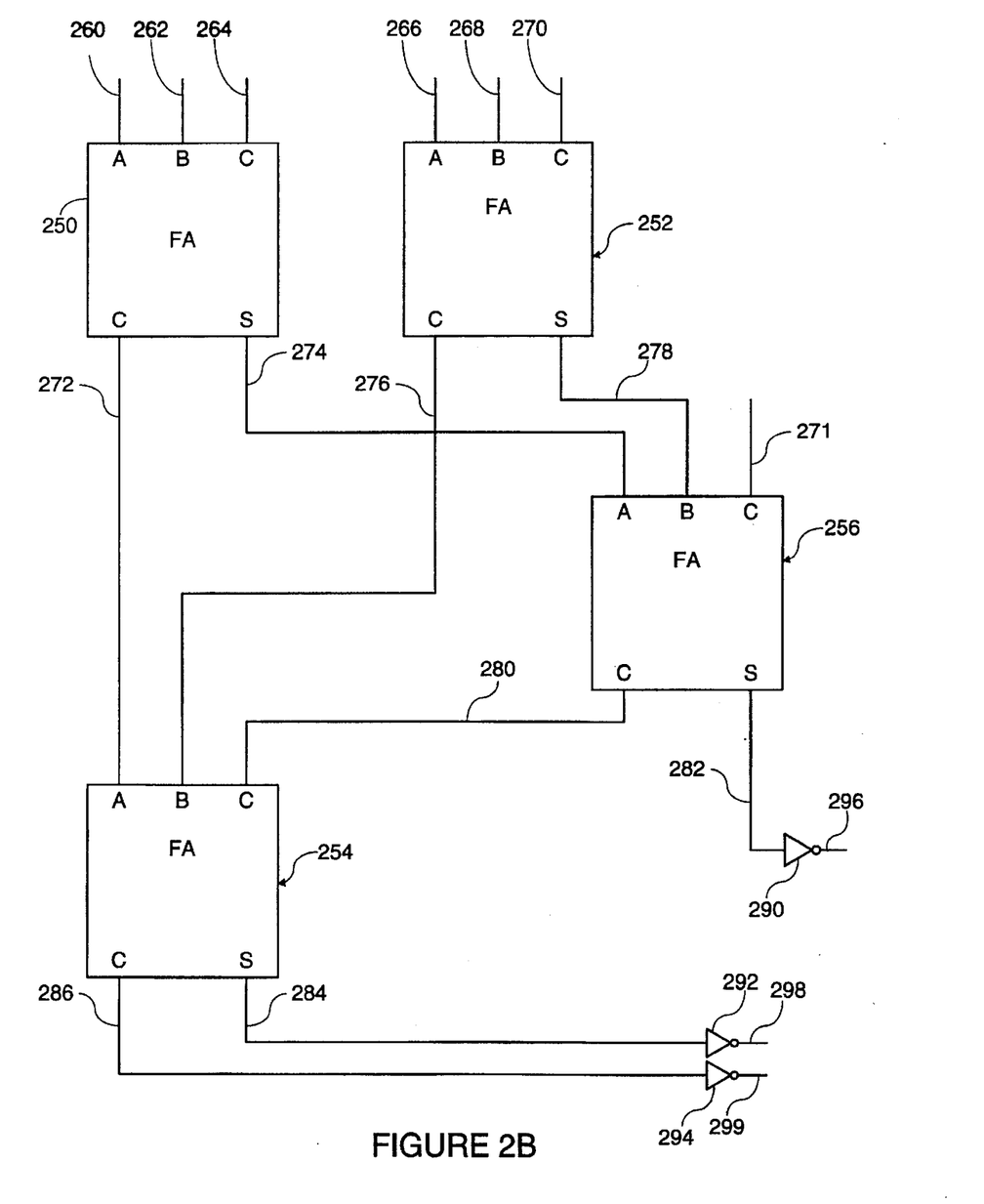
FIG. 2B is a schematic diagram showing four fast adders and three inverters used to provide the complement of a count of the number of set bits in a six bit word according to the present invention.

In another embodiment, the bits of the non-repeating column are input to one or more fast adders in order to calculate complement the number of set bits. Referring now to FIG. 2B, connections are shown which allow fast adders 250, 252, 254, 256 to complement the count of the number of set bits in a six bit word.

The low order bit, bit 0 is coupled to adder input 271, with the remaining bits 1, 2, 3, 4 and 5 coupled to inputs 268, 266, 264, 262 and 260, respectively. Carry input 270 is connected to logical 0, and not otherwise used as an output. Adder outputs 282, 284, 286 produce the count of the number of set bits at the inputs 271, 268, 266, 264, 262, 260. The outputs 282, 284, 286 are inverted using inverters 290, 292, 294 which complement the count to produce an error-detection code at outputs 296, 298, 299.

Figure 3A:
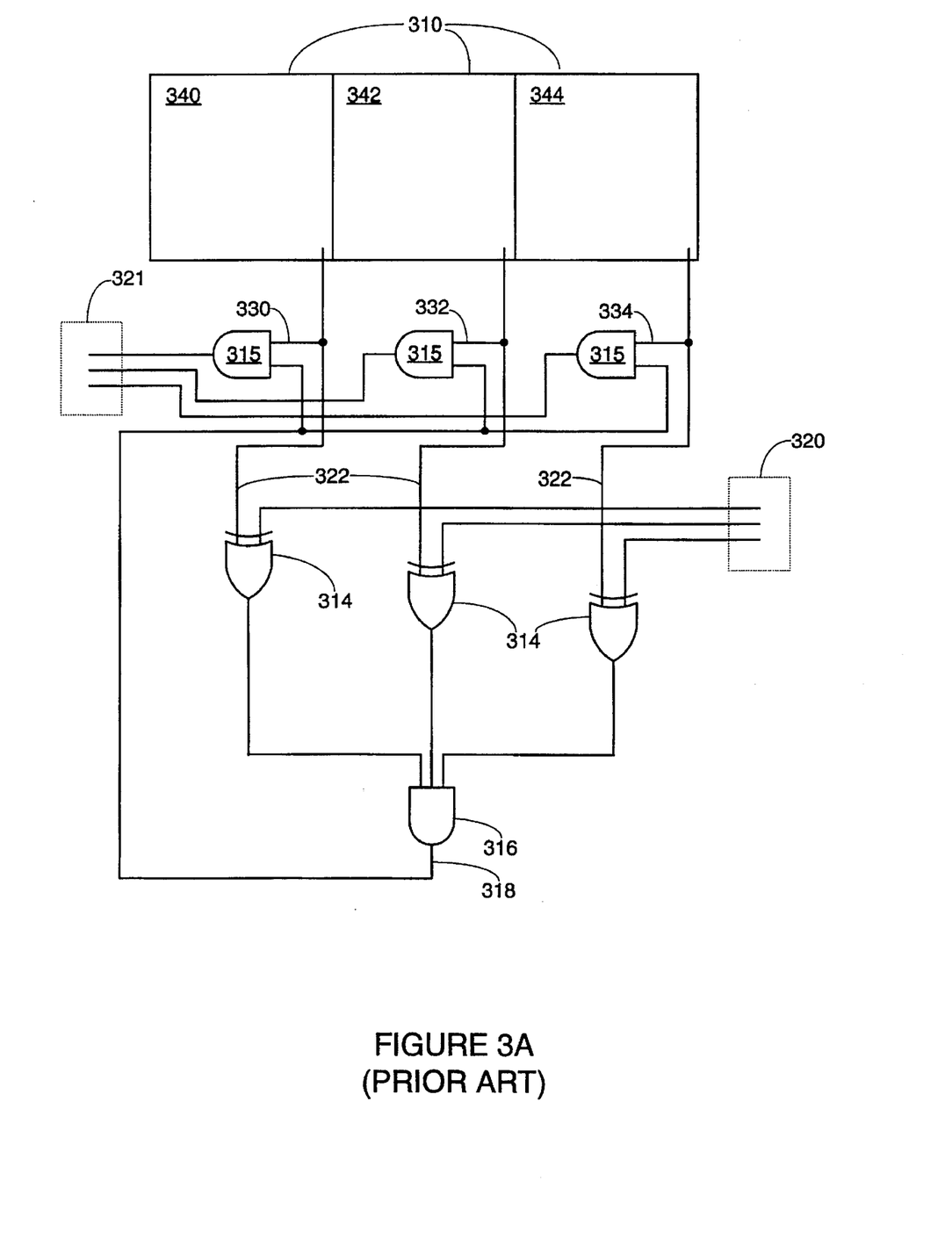
FIG. 3A is a schematic diagram of conventional circuitry which drives a first input equal to a second input onto a set of output lines.

In one embodiment, the prior art searching function for the table 110 is performed by locating the row in index column 120 having an entry in the index column 120 which matches a preselected number. Referring now to FIGS. 1 and 3A, an apparatus is shown for determining whether an entry in column 120 matches a specified number. The specified number is provided to inputs 320 coupled to EXCLUSIVE-OR-gates 314. Each bit 340, 342, 344 in one row 310 of column 120 is coupled to the second input 322 of one of the EXCLUSIVE-OR-gates 314 which signal high if each bit 340, 342, 344 is equal to the corresponding input 320. EXCLUSIVE OR-gates 314 are coupled to AND-gate 316 having an output 318 signaling high if all bits 340, 342, 344 match the corresponding inputs 320. The output 318 is coupled to the first input of AND-gates 315. Inputs 330, 332, 334 are coupled to receive the bit 340, 342, 344 corresponding to that position and this bit is output on output line 321 if the row 310 in column 120 matches the input 320.

Figure 3B:
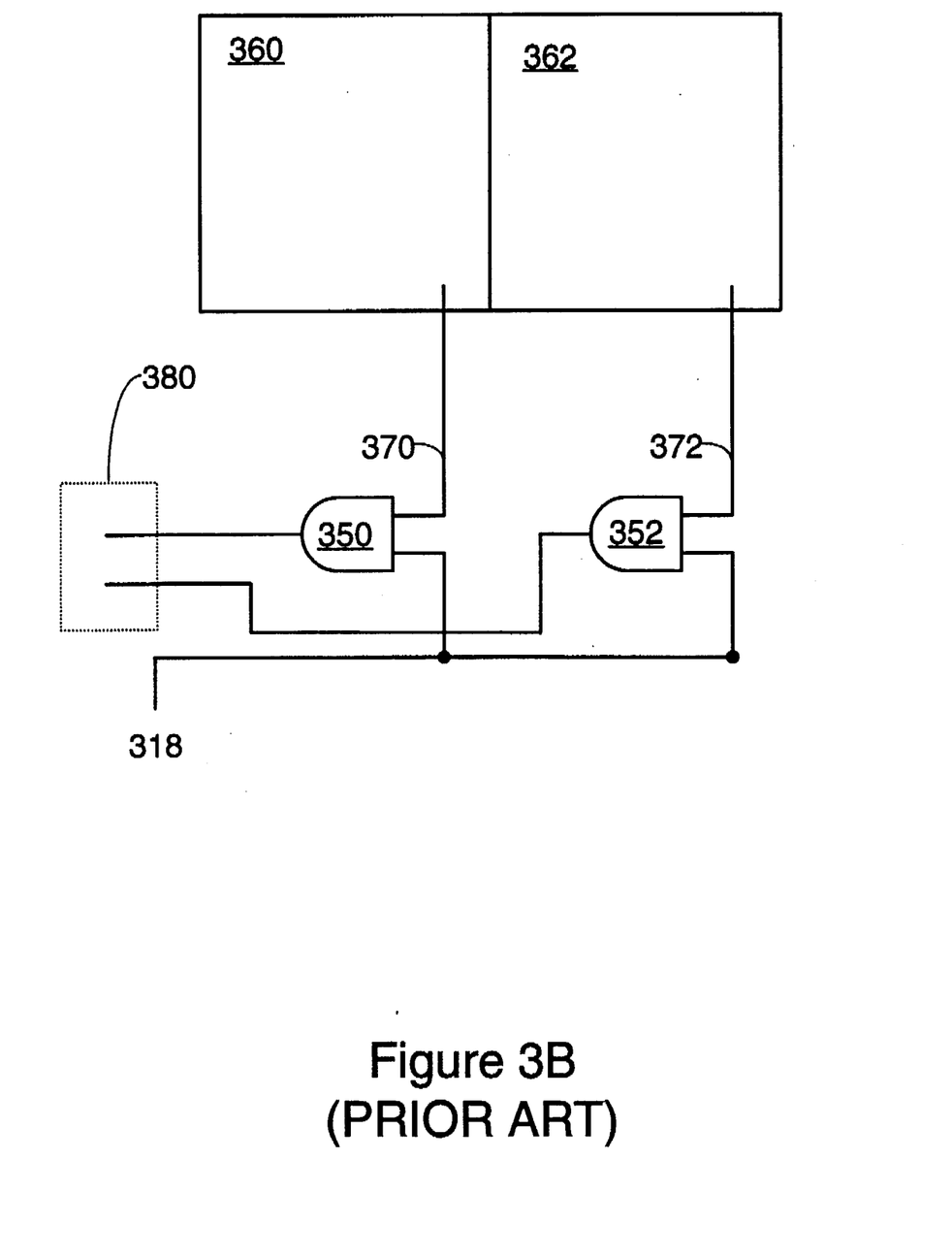
FIG. 3B is a schematic diagram of conventional circuitry which drives a pair of bits onto a set of output lines.

Referring now to FIGS. 1, 3A and 3B, in one embodiment, output 318 is coupled to AND-gates 350, 352 which are coupled to drive the error code bits 360, 362 from column 150 presented at inputs 370, 372 onto outputs 380 corresponding to the selected row or rows of the non-repeating column 124.

Figure 4:
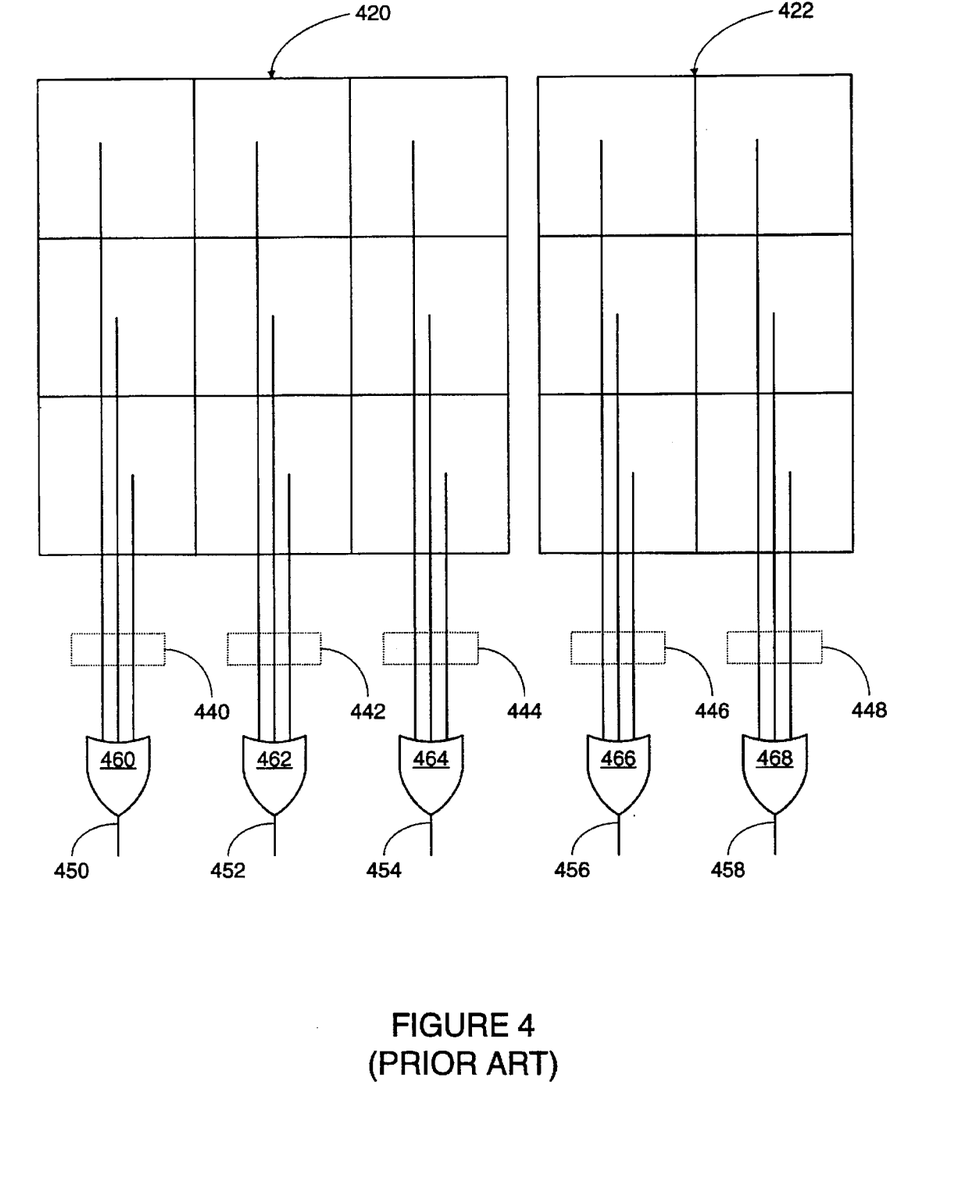
FIG. 4 is a schematic diagram of conventional circuitry which logically ORs five groups of three bits per group.

In one embodiment, the selected row or rows are output by logically OR-ing all rows having an entry in the index column 120 that matches the preselected number. Logically OR-ing, or logically summing means computing the logical sum of each bit. For example, 100 OR-ed or summed with 101 is equal to 101. Logical OR functions are efficient to implement in integrated circuits, but logically OR-ing can mask the fact that two numbers have been OR-ed when only one number is expected. Referring now to FIGS. 1 and 4, a device is shown for a logically OR-ing inputs 440, 442, 444, 446, 448 to produce outputs 450, 452, 454, 456, 458 using OR gates 460, 462, 464, 466, 468. The columns in box 420 represent individual bits in each entry of the non-repeating column 120 and box 422 represents the error code column with each box in FIG. 4 holding one bit. While such an OR-ing function appears cumbersome in the Figure, in an integrated circuit, such a function is quite efficient, although it masks multiple-match output errors as described above.

After the non-repeated column entry and the error code corresponding to the selected row or OR-ed rows appear at the outputs 450, 452, 454, 456, 458 a recomputed error code is computed using the OR-ed outputs 450, 452, 454 corresponding to the non-repeating column 124 of the selected row or rows. The recomputed error code is compared against the OR-ed outputs 456, 458 corresponding to the error code column 150. If only one entry has been output, the outputs 456, 458 corresponding to the error code column 150 should be equal to the recomputed error code. Otherwise, no such equality will appear. The apparati shown in FIGS. 2A or 2B or a combination of the apparati may be used to calculate the recomputed error code.

Figure 5:
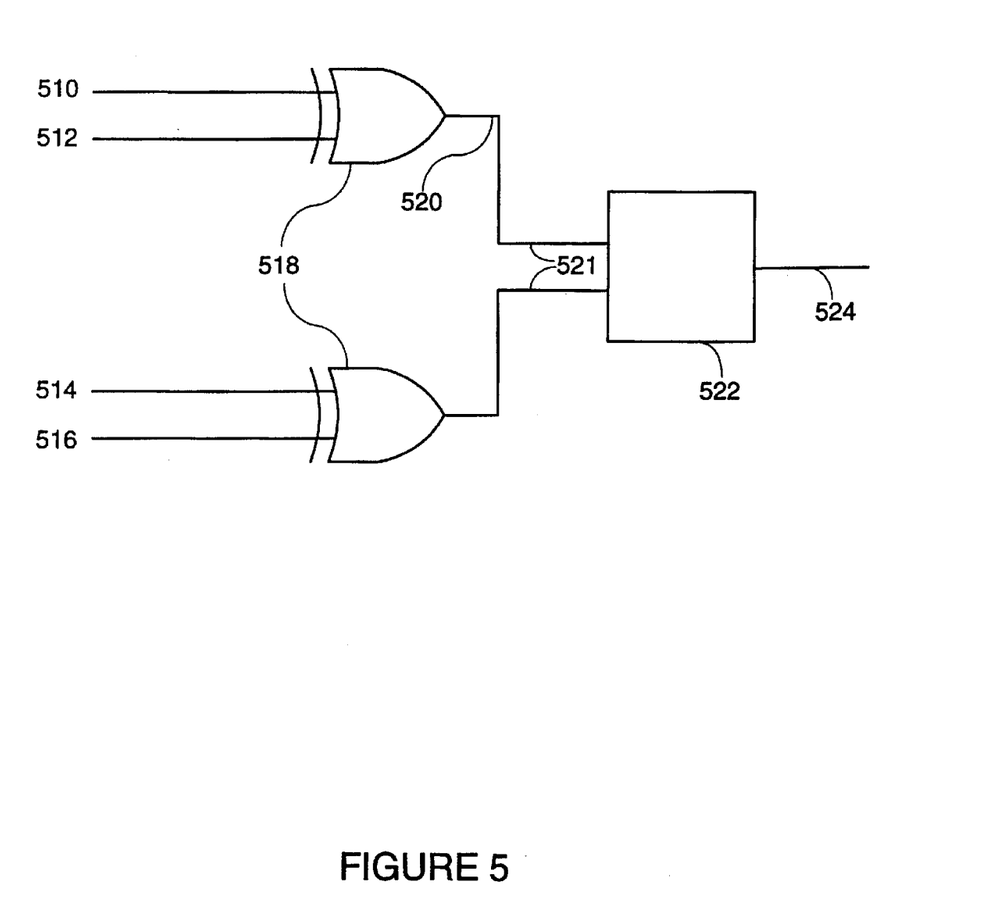
FIG. 5 is a schematic diagram of an error detection circuit according to the present invention.

Referring now to FIG. 5 one embodiment of a device for detecting equality is shown. The OR-ed error code and the recomputed error code are tested for bitwise equality using the apparatus of FIG. 5. The low order bit from the OR-ed error code is coupled to EXCLUSIVE-OR-gate input 510, and the high order bit is coupled to EXCLUSIVE-OR-gate input 514. The low order bit from the recomputed error code is coupled to EXCLUSIVE-OR-gate input 512, and the high order bit is coupled to EXCLUSIVE-OR-gate input 516. In one embodiment, gate 522 is a two-input OR-gate, which signals high at the output 524 if the OR-ed error code is not equal to the recalculated error code, signaling that an error potentially exists due to duplicate selection as described above.

In another embodiment, gate 522 is a NOR-gate to provide the opposite signal. In another embodiment, the gate 522 is an open collector OR-gate to provide a single signal.

Figure 2C:
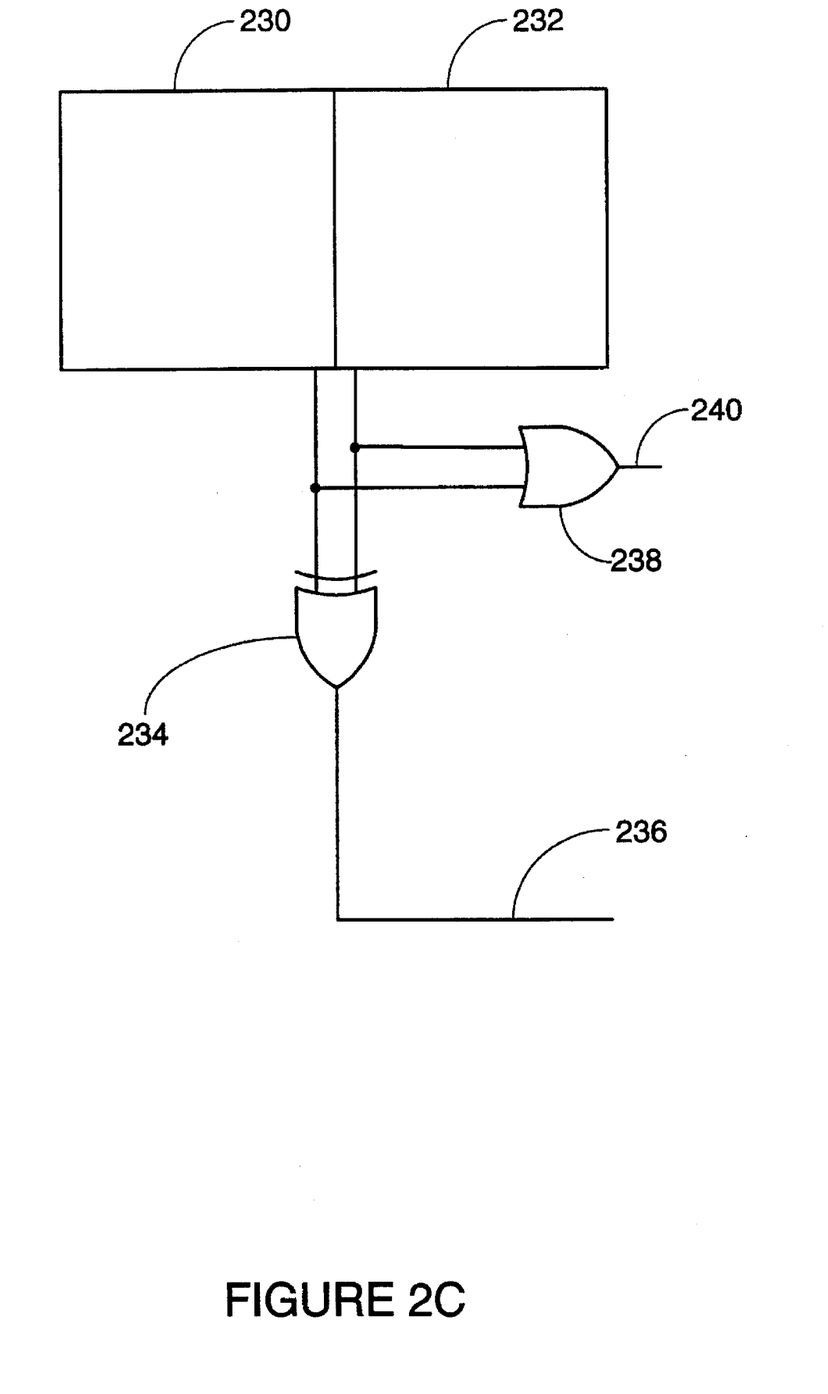
FIG. 2C is a schematic diagram of a device which produces a two-bit output equal to the count of the number of set bits at the input according to the present invention.

Referring again to FIG. 4, in another embodiment, the recomputed error code is computed differently from the method described above. The recomputed error code is the sum of the set OR-ed bits 456, 458. The OR-ed error code and the recalculated error code are tested for bitwise inequality to provide for simpler circuitry. For example, in the non-repeating column entry the apparatus of FIG. 2C is used, which is identical to FIG. 2A except the outputs 240, 236 are inverted from the outputs 220, 216 of FIG. 2A. In another embodiment, the apparatus of FIG. 2B is used without inverters 290, 292, 294. Instead, outputs 282, 284, 286 replace outputs 296, 298, 299. Where such apparati are used, the each bit of the OR-ed error code should be the opposite of the recalculated error code, or a multiple selection error has occurred. To detect this condition, the apparatus of FIG. 5 is used as described above, except gate 522 is an AND-Gate, NAND-gate, or open collector version to detect inequality.

Figure 6A:
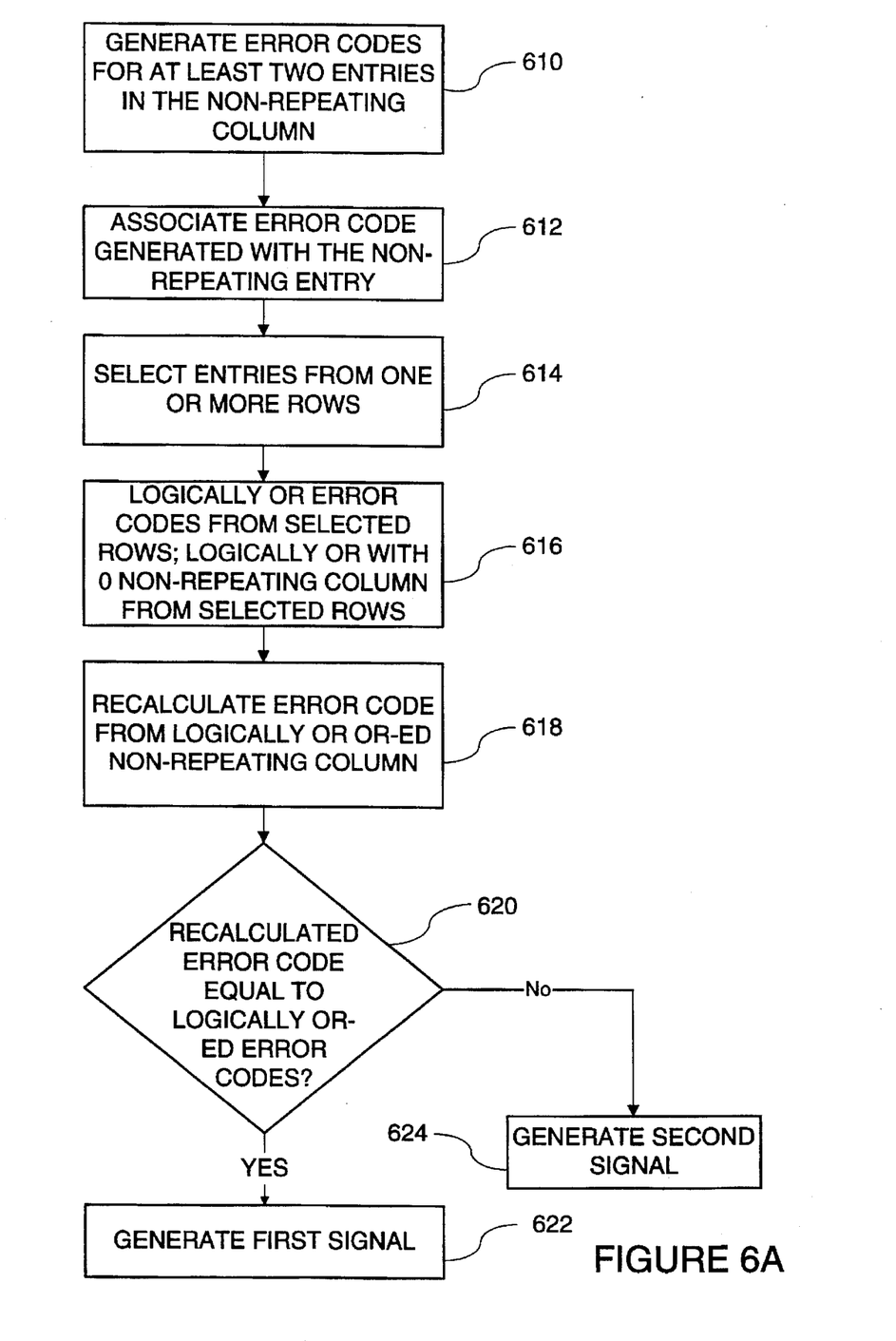
FIG. 6A is a flowchart showing a method of the present invention.

Referring now to FIG. 6A, one embodiment of the method of the present invention is shown. The error code for two or more rows is generated 610 by calculating and complementing the number of set bits in an entry in the non-repeating column, then associated 612 with the entry from the non-repeating column from which the error code was generated. Certain rows are selected 614, for example, by matching all rows which contain data in one column matching a preselected number. Corresponding bits in the selected rows are logically OR-ed 616 with each other. The error code for the resulting OR-ed non-repeating column is recalculated 618 by counting the number of set bits in the logically OR-ed non-repeating column and complementing the count. The recalculated error code is compared 620 with the resulting OR-ed error code column. If the recomputed error code is equal to the OR-ed error code, a first signal is generated 622. If the recomputed error code is not equal to the OR-ed error code, a second signal is generated 624. The first and second signals indicate the absence or presence of a multiple match. The generation of a first signal and the second signal may be replaced by the generation of a single signal only if equality or inequality is detected, and no signal generated in the opposite case.

Figure 6B:
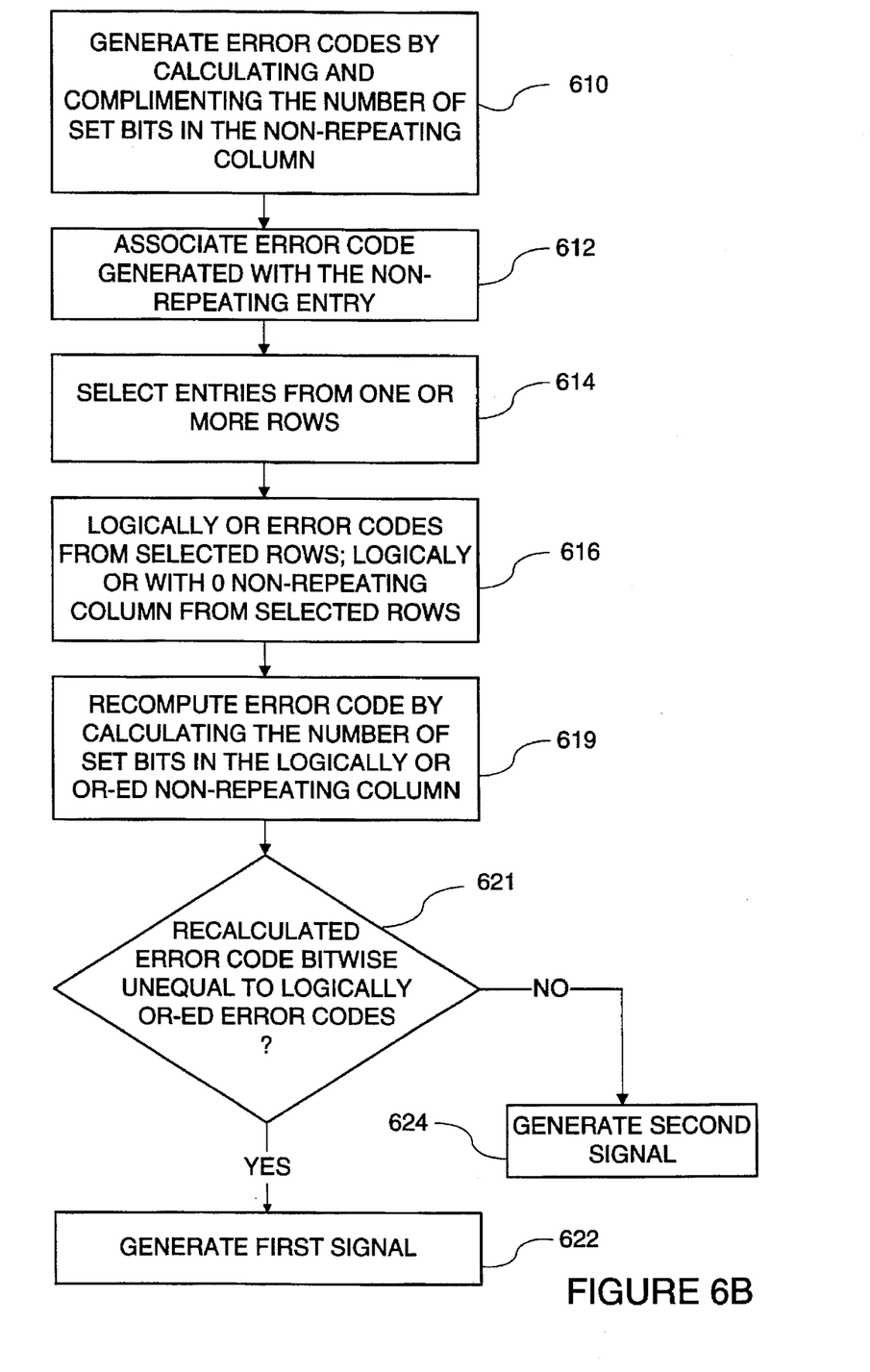
FIG. 6B is a flowchart showing an alternate method of the present invention.

Referring now to FIG. 6B, an alternate method of the present invention is shown. The method operates as with FIG. 6A, except the recomputed error code is calculated 619 by counting the number of set bits, and the comparison 621 is performed by testing the recomputed error code and OR-ed error code for bitwise inequality.

What is claimed is:

1. A method of testing a binary code comprising a first part and a second part, comprising:

summing each bit in the first part of the code to produce a sum;

complementing the sum to produce a complemented sum;

comparing the complemented sum with the second part of the code; and responsive to the complemented sum not equal to the second part of the code, causing a first signal to be generated.

2. The method of claim 1 wherein the binary code comprises the logical sum of at least two binary codes selected from a set of codes.

3. The method of claim 2 wherein each code selected from the set comprises a first part and a second part comprising the sum of each bit in the first part.

4. The method of claim 3 wherein:

each code selected from the set additionally comprises a third part; and the third part of at least one code selected is equal to a desired number.

5. The method of claim 4 wherein the third part of all indicated codes selected are equal to each other.

6. The method of claim 2 wherein each code selected from the set of codes comprises a first part and a second part comprising the complement of the sum of each bit in the first part.

7. The method of claim 1 comprising the additional step of responsive to the complemented sum equal to the second part of the code causing a second signal to be generated.

8. A method of detecting the selection of multiple members matching a specified criteria in a set of a plurality of objects, comprising coupling a unique binary code comprising bits to each of a plurality of the objects in the set;

computing from the unique binary code a binary error code for each of a plurality of objects in the set;

coupling a plurality of the error codes to the code from which the error code was computed;

selecting the objects in the set matching the specified criteria;

computing a first logical sum comprising bits, the first logical sum equal to the logical sum of the codes coupled to each object selected;

computing a test code from the first logical sum;

computing a second logical sum equal to the logical sum of the error codes coupled to each of the binary codes of the objects selected;

testing for equality the second logical sum with the test code; and generating a first signal responsive to the test for equality.

9. The method of claim 8 wherein the first signal is generated if the second logical sum is equal to the test code.

10. The method of claim 9 comprising the additional step of generating a second signal responsive to the test for equality determining that the second logical sum is not equal to the test code.

11. The method of claim 8 wherein the first signal is generated if the second logical sum is not equal to the test code.

12. The method of claim 11 comprising the additional step of generating a second signal responsive to the test for equality determining that the second logical sum is equal to the test code.

13. The method of claim 8 wherein the first signal is generated if the second logical sum is bitwise unequal to the test code.

14. The method of claim 13 comprising the additional step of generating a second signal responsive to the test for equality determining that the second logical sum is equal to the test code.

15. The method of claim 8 wherein the error code computed is equal to the sum of the bits in the binary code.

16. The method of claim 8 wherein the error code computed is equal to the complement of the sum of the bits in the binary code.

17. The method of claim 8 wherein the test code is equal to the sum of the bits in the first logical sum.

18. The method of claim 8 wherein the test code is equal to the complement of the sum of the bits in the first logical sum.

19. An apparatus for testing a code comprising a first part comprising at least one bit and a second part comprising at least one bit, the apparatus comprising;

a first equality detector comprising a first set of inputs, a second set of inputs coupled to the second part of the code and an output having a first state responsive to the first set of inputs being equal to the second set of inputs, the output having a second state responsive to the first set of inputs being not equal to the second set of inputs; and a code part generator having a set of a plurality of inputs coupled to the first part of the code and a set of at least one output coupled to the first set of equality generator inputs, the code part generator for producing at its output a complement of a sum of each bit in the first part of the code.

20. An apparatus for testing a code comprising a first part comprising at least one bit and a second part comprising at least one bit, the apparatus comprising:

a first equality detector comprising a first set of inputs, a second set of inputs coupled to the second part of the code and an output having a first state responsive to the first set of inputs being equal to the second set of inputs, the output having a second state responsive to the first set of inputs being not equal to the second set of inputs; and a code part generator having a set of a plurality of inputs coupled to the first part of the code and a set of at least one output coupled to the first set of equality generator inputs, the code part generator for producing at its output a sum of each bit in the first part of the code.

* * * * *